(12) United States Patent
Li et al.

(10) Patent No.: US 10,571,526 B2
(45) Date of Patent: Feb. 25, 2020

(54) GROUND FAULT CIRCUIT INTERRUPTER

(71) Applicant: Chengli Li, Suzhou (CN)

(72) Inventors: Chengli Li, Suzhou (CN); Guolan Yue, Suzhou (CN)

(73) Assignee: Chengli Li, Suzhou (CN)

( * ) Notice: Subject to any disclaimer, the term of this patent is extended or adjusted under 35 U.S.C. 154(b) by 293 days.

(21) Appl. No.: 15/878,242

(22) Filed: Jan. 23, 2018

(65) Prior Publication Data

US 2018/0149690 A1 May 31, 2018

Related U.S. Application Data

(63) Continuation-in-part of application No. 15/819,353, filed on Nov. 21, 2017, which is a
(Continued)

(30) Foreign Application Priority Data

Nov. 8, 2017 (CN) .......................... 2017 1 1089746
Nov. 8, 2017 (CN) ...................... 2017 2 1476818 U

(51) Int. Cl.
*H02H 3/00* (2006.01)
*G01R 31/50* (2020.01)
*H02H 3/33* (2006.01)
*H01H 71/12* (2006.01)
*H02H 3/10* (2006.01)
(Continued)

(52) U.S. Cl.
CPC ......... *G01R 31/50* (2020.01); *G01R 31/2827* (2013.01); *G01R 35/00* (2013.01); *H01H 71/125* (2013.01); *H01H 71/128* (2013.01); *H02H 3/105* (2013.01); *H02H 3/335* (2013.01); *H02H 3/338* (2013.01); *H01H 83/04* (2013.01); *H01H 83/144* (2013.01); *H01H 2071/044* (2013.01)

(58) Field of Classification Search
None
See application file for complete search history.

(56) References Cited

U.S. PATENT DOCUMENTS 5,966,280 A * 10/1999 Cerminara ......... H01H 71/0228
361/42
7,149,065 B2 12/2006 Baldwin et al.
(Continued)

*Primary Examiner* — Stephen W Jackson
(74) *Attorney, Agent, or Firm* — Chen Yoshimura LLP

(57) ABSTRACT

A ground fault circuit interrupter device includes a switch module having a reset switch, a control switch mechanically linked to the reset switch, a ground fault detection module, a self-testing module and a tripping module. The switch module controls the electrical connection between the input and output ends of the device. The ground fault detection module detects a leakage current signal at the output end. The self-testing module is coupled to the ground fault detection module and periodically generates a self-test pulse signal which simulates the leakage current signal. The tripping module is electrically coupled to the ground fault detection module and mechanically coupled to the switch module and the control switch, to control the movement of the switch module and the control switch. The control switch, which opens and closes at the same time as the reset switch, controls the power supply to the self-testing module.

7 Claims, 4 Drawing Sheets

Related U.S. Application Data continuation-in-part of application No. 15/586,952, filed on May 4, 2017, now Pat. No. 9,871,366, which is a continuation-in-part of application No. 15/209,563, filed on Jul. 13, 2016, now Pat. No. 9,857,448.

(51) Int. Cl.
*G01R 35/00* (2006.01)
*G01R 31/28* (2006.01)
*H01H 71/04* (2006.01)
*H01H 83/04* (2006.01)
*H01H 83/14* (2006.01)

(56) References Cited

U.S. PATENT DOCUMENTS

| | | | |
|---|---|---|---|
| 7,692,904 B2 * | 4/2010 | Li | H02H 11/002 |
| | | | 361/42 |
| 7,800,873 B2 * | 9/2010 | Batko | H02H 3/04 |
| | | | 361/42 |
| 9,535,106 B2 | 1/2017 | Li | |
| 9,547,047 B2 | 1/2017 | Li et al. | |
| 2005/0243484 A1 | 11/2005 | Kim | |
| 2012/0119918 A1 | 5/2012 | Williams | |
| 2014/0117995 A1 | 5/2014 | Topucharla | |
| 2014/0278157 A1 | 9/2014 | Simonin | |
| 2015/0070801 A1 | 3/2015 | Endozo | |
| 2017/0222425 A1 | 8/2017 | Li et al. | |

* cited by examiner

GROUND FAULT CIRCUIT INTERRUPTER

BACKGROUND OF THE INVENTION

Field of the Invention

This invention relates to household appliances, and in particular, it relates to a ground fault circuit interrupter.

Description of Related Art

With the wide use of home appliances, the safety of the appliances becomes more and more important. Currently, ground fault circuit interrupters are installed at the output end of power outlets from the grid or the input end of some appliances, which improves the safety of the appliances. However, in practice, due to long time use or other factors, some problems still remain due to certain shortcomings in the structures of current ground fault circuit interrupters, even when users use the self-testing function of the ground fault circuit interrupters. For example, sometimes, when the ground fault circuit interrupter device detects a current leakage, it cannot timely disconnect the power source because of a malfunction in the internal drive structure. Thus, the ground fault circuit interrupter is still prone to losing its leakage current protection function during use, which may cause dangerous situations. Further, current ground fault circuit interrupters that have self-testing functions can only alert the user of the malfunction using indicator lights or audible signals; for users who cannot recognize a malfunction in the device based on the indicator lights or audible signals, the current ground fault circuit interrupters cannot provide sufficient protection and so there are still safety threats.

Thus, there is a need for a ground fault circuit interrupter that is easy to install and low in cost and that has self-testing functions and redundant protection functions.

SUMMARY

Accordingly, the present invention provides a ground fault circuit interrupter that has redundant protection functions with improved safety and reliability.

The present invention provides a ground fault circuit interrupter which includes: a phase line and a neutral line; a switch module including a reset switch, coupled on the phase line and the neutral line between an input end and an output end to control electrical connection between the input end and the output end; a control switch, mechanically linked to the reset switch, wherein the control switch and the reset switch are either both open or both closed; a ground fault detection module, for detecting whether a leakage current signal exists at the output end and generating a trip signal when the leakage current signal is detected; a self-testing module, coupled to the ground fault detection module and periodically generating a self-test pulse signal which simulates the leakage current signal, the self-testing module including a power supply circuit; and a tripping module, electrically coupled to the ground fault detection module and mechanically coupled to the switch module and the control switch, the tripping module being operable to open the reset switch and the control switch in response to the trip signal; wherein the control switch is connected on a conducting path between the phase line at the input end and the power supply circuit of the self-testing module, and wherein when the control switch is open, no power is supplied to the power supply circuit of the self-testing module and the self-testing module is non-operational.

BRIEF DESCRIPTION OF THE DRAWINGS

The following drawings are used to describe the embodiments. These drawings explain the principles of the invention, and only illustrate the structures that are necessary for understanding the invention. The drawings are not necessarily to scale. In the multiple drawings, the same or similar reference symbols denote the same or similar structures.

DETAILED DESCRIPTION OF PREFERRED EMBODIMENTS

Embodiments of the invention are described below with reference to the drawings. The drawings illustrate specific embodiment that can achieve the goals of the present invention. The illustrated embodiments are not intended to show all possible embodiments of the invention. It should be understood that other embodiments can be constructed without departing from the spirit of the invention, and the illustrated embodiments may be modified structurally or logically. Thus, the detailed descriptions below are limiting, and the scope of the invention should be determined by the appended claims.

Embodiments of the present invention provide a ground fault circuit interrupter, which can perform self-testing during use. The ground fault circuit interrupter according to embodiments of the present invention includes: a switch module, a ground fault detection module, a self-testing module, and a tripping module. The ground fault detection module detects whether a ground fault is present at the power output end. During use, the self-testing module detects whether the ground fault detection module is functioning normally. When the ground fault detection module detects a ground fault, the tripping module drives the switch module to disconnect the electrical coupling, thereby disconnecting the power source.

Figure 1:
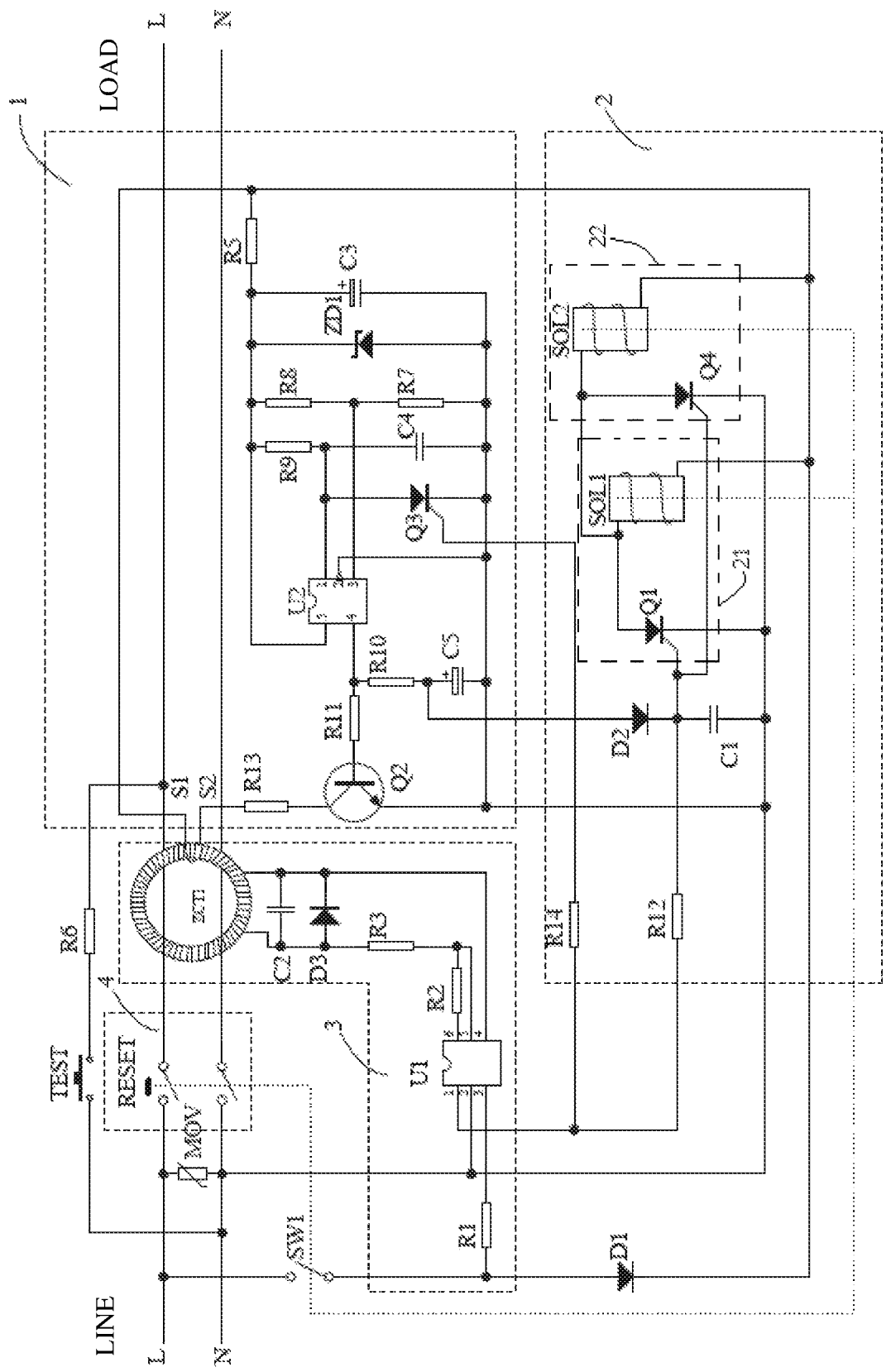
FIG. 1 is a circuit diagram showing a first embodiment of the present invention.

FIG. 1 is a circuit diagram showing a ground fault circuit interrupter according to the first embodiment of the present invention. As shown in FIG. 1, the ground fault circuit interrupter of the first embodiment includes an input end LINE and an output end LOAD, a switch module 4 which controls the electrical connection between the input end LINE and output end LOAD, a self-testing module 1, a tripping module 2, and a ground fault detection module 3. The ground fault detection module 3 detects whether a leakage current signal is present at the input end LINE and output end LOAD, and more specifically, whether a leakage current signal is present on the phase line L and neutral line N on the output end LOAD. The self-testing module 1 determines whether the ground fault detection module 3 is functioning normally. When the ground fault detection module 3 detects a leakage current signal, it controls the tripping module 2 to drive the switch module 4 to disconnect the electrical connection, thereby disconnecting the power source to protect the appliance.

The operation of the first embodiment of FIG. 1 is described below.

In this embodiment, the ground fault detection module 3 includes a leakage current detection ring ZCT1 that has the phase line L and the neutral line N pass through it, and a leakage current detection unit (including a leakage current detection chip U1 and related electronic components couplet to it) coupled to the leakage current detection ring ZCT1. When there is a current imbalance in the phase line L and the neutral line N passing through the leakage current detection ring ZCT1, i.e., there is a leakage current signal, the leakage current detection ring ZCT1 generates a corresponding voltage signal. The leakage current detection chip U1 detects the voltage signal on the leakage current detection ring ZCT1, and based on it, generates a trip signal to control the tripping module 2 to drive the switch module 4 to disconnect the power source.

In this embodiment, the tripping module 2 includes two tripping drive components 21 and 22 connected in parallel. Each tripping drive component includes a semiconductor device (silicon-controlled rectifier (SCR) Q1 or Q4) that is coupled to the ground fault detection module 3 and the self-testing module 1, and a tripping coil (solenoids SOL1 or SOL2) that is coupled to the SCR (Q1 or Q4). When the leakage current detection chip U1 detects that the voltage signal generated by the leakage current detection ring ZCT1 reaches a predefined threshold, it generates a trip signal to control the SCRs Q1 and Q4 to become conductive. When Q1 and Q4 are conductive, the tripping coils SOL1 and SOL2 experience large currents, which cause the switch module 4 to disconnect the lines. In use, when the SCR Q1 or the tripping coil SOL1 malfunctions (for example, the cathode or anode of the SCR Q1 is open, the tripping coil SOL1 is open, etc.) but the SCR Q4 and the tripping coil SOL2 still function normally, and when the leakage current detection chip U1 detects the voltage signal on the leakage current detection ring ZCT1, the SCR Q4 and the tripping coil SOL2 function normally to drive the switch module 4 to disconnect the power source. The operation is similar when Q4 or SOL2 malfunctions.

In this embodiment, the self-testing module 1 performs a periodic self-testing of the ground fault detection module 3. The self-testing module 1 includes a power supply circuit, a periodic timing circuit and a self-test pulse signal circuit that generates a simulated leakage current signal. Referring to FIG. 1, the power supply circuit includes a resistor R5, a voltage regulator ZD1, and a capacitor C3. The periodic timing circuit includes serial connected resistor R9 and timing component (e.g. capacitor C4), for generating a time interval for the self-test pulse signal. The self-test pulse signal circuit includes a switch device (e.g. transistor Q2), a comparator U2, a diode D2, a capacitor C5, a resistor R10, and resistors R11 and R13 which are respectively coupled to the base and collector of transistor Q2, etc. When the ground fault circuit interrupter is operating, the self-testing module 1 periodically applies to the leakage current detection ring ZCT1 a simulated leakage current signal that reaches the predefined threshold value.

More specifically, resistor R5, voltage regulator ZD1 and capacitor C3 provide a working power for the comparator U2 (at pin 5 of the comparator U2). Resistors R7 and R8 form a voltage divider coupled to the working power to provide a reference voltage for the comparator U2 (at pin 3 of the comparator U2). Capacitor C4 is charged by the working power via resistor R9 to generate a time interval for the self-test pulse signal, which is input to the comparator U2 (at pin 1 of the comparator U2). When the voltage on capacitor C4 rises to the level of the reference voltage, the comparator U2 (at pin 4 of the comparator U2) outputs a signal, which drives transistor Q2 to become conductive, which in turn generates, via resistor R13, a self-test pulse signal on the leakage current detection ring ZCT1.

The leakage current detection chip U1 detects this self-test pulse signal, and drives SCR Q3 to become conductive; capacitor C4 is then discharged via SCR Q3. More specifically, when the self-test pulse signal is generated, the leakage current detection chip U1 outputs a signal to drive SCRs Q1, Q4 and Q3. This signal drives SCR Q3 to become conductive, so that capacitor C4 is discharged, thereby starting the next self-test period. At the time SCR Q3 is driven, the self-test pulse signal is turned off; the delay caused by capacitor C1 and resistor R12 causes SCRs Q1 and Q4 to remain non-conductive. As a result, the tripping coils SOL1 and SOL2 cannot form a current loop, so switch module 4 remain closed (connected). If a sustained leakage current signal is detected, the SCR Q3 becomes conductive, so that the self-test pulse signal circuit does not generate a self-test pulse signal; thus SCRs Q1 and Q4 become conductive, causing tripping coils SOL1 and SOL2 to form current loops, which in turn drives switch module 4 to disconnect the power source.

When the self-testing module 1 detects that the ground fault detection module 3 is malfunctioning, e.g. the leakage current detection chip U1 malfunctions and cannot output a signal to SCR Q3 (nor to Q1 or Q4), so SCR Q3 is not made conductive, then capacitor C4 does not have a discharge circuit; as a result, the self-testing module 1 (at pin 4 of the comparator U2) will continue to output a high voltage. Thus, capacitor C5 is charged via resistor R10, and when its voltage reaches the predefined threshold, diode D2 conducts. As a result, SCR Q1 and/or Q4 become conductive, which causes tripping coils SOL1 and/or SOL2 to move, which in turn controls the switch module 4 to disconnect the power. In use, when SCR Q1 or tripping coil SOL1 malfunctions (for example, the cathode and/or anode of the SCR Q1 is open, the tripping coil SOL1 is open, etc.) but SCR Q4 and tripping coil SOL2 still function normally, and when comparator U2 detects a malfunction in the ground fault detection module 3, the comparator U2 can control SCR Q4 to conduct. As a result, tripping coil SOL2 experience a large current and controls the switch module 4 to disconnect the power. The operation is similar when SCR Q4 and/or tripping coil SOL2 malfunctions.

To summarize, in this embodiment, by using the self-testing module 1, the ground fault circuit interrupter can, when it is functioning normally, periodically self-test whether its leakage current protection function is normal. When the ground fault detection module 3 malfunctions, the device controls the tripping module to drive the switch module to disconnect the power source. And/or, when the ground fault detection module 3 detects a leakage current signal, the device controls the tripping module to drive the switch module to disconnect the power source. Further, when any tripping drive component (21 or 22) of the tripping module malfunctions, the normal function of the other tripping drive component (22 or 21) is not affected, so that the ground fault circuit interrupter can disconnect the power source.

In addition to SCRs, MOSFETs (metal oxide semiconductor field effect transistors) and transistors can also be used as the semiconductor device.

Figure 2:
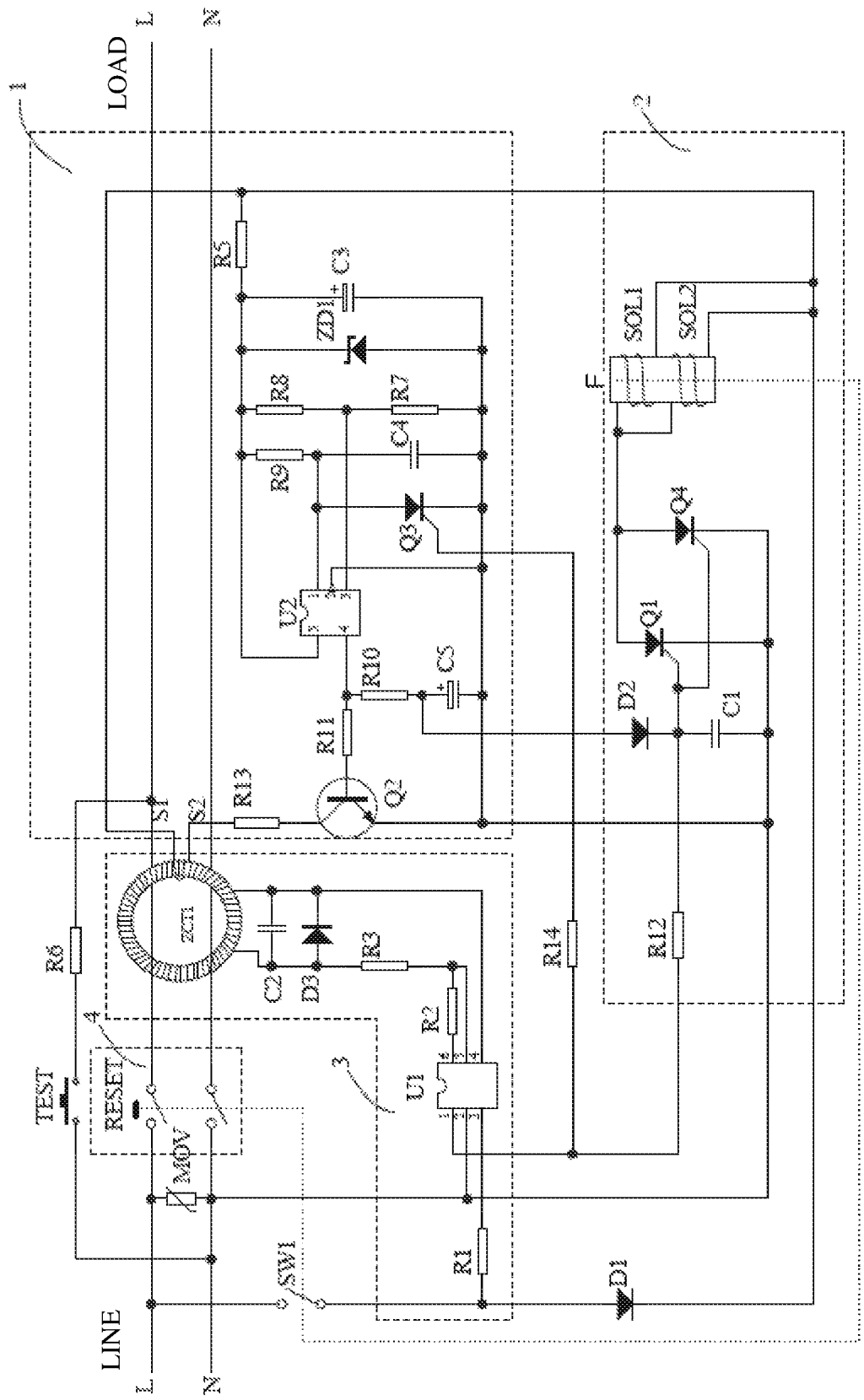
FIG. 2 is a circuit diagram showing a second embodiment of the present invention.

FIG. 2 is a circuit diagram showing the second embodiment of the present invention. Its operation is as follows.

As compared to FIG. 1, the structure of the tripping module 2 in FIG. 2 is modified: Two coils are disposed on the tripping mechanism F, respectively forming tripping coils SOL1 and SOL2. The anode of SCR Q1 is coupled to both of the tripping coils, and the anode of SCR Q4 is also coupled to both of the tripping coils. The control electrode of SCR Q1 and the control electrode of SCR Q4 are both coupled to the ground fault detection module 3 and the tripping module 2. Thus, the combinations of SCR Q1 and tripping coil SOL1, SCR Q1 and tripping coil SOL2, SCR Q4 and tripping coil SOL1, and SCR Q4 and tripping coil SOL2 can respectively form different tripping drive components. Thus, when the ground fault detection module 3 detects a leakage current signal and/or the self-testing module 1 detects a malfunction of the ground fault detection module 3, the SCR Q1 and/or SCR Q4 can be controlled to control tripping coil SOL1 and/or tripping coil SOL2, to in turn drive the switch module 4 to disconnect the electrical connection, thereby disconnecting the power source. Further, when SCR Q1 or Q4 malfunctions, the function of the other SCR Q4 or Q1 is not affected, which can control the tripping coil SOL1 and/or SOL2 to drive the switch module 4 to disconnect the power source. Or, when tripping coil SOL1 or SOL2 malfunctions, the other tripping coil SOL2 or SOL1 can still be controlled by SCR Q1 and/or Q4 to drive the switch module 4 to disconnect the power source. Or, when one of the SCRs Q1 or Q4 malfunctions and one of the tripping coils SOL1 and SOL2 malfunctions, the other normally functioning SCR and tripping coil can cooperate to drive the switch module 4 to disconnect the power source.

Thus, compared to the first embodiment, the tripping module of this embodiment is more flexible and more reliable; when one of the SCRs and/or one of the tripping coils of the tripping module malfunctions, the tripping module can still function properly. This greatly improves the usability, flexibility, reliability and safety of the ground fault circuit interrupter.

Moreover, in the embodiments of FIGS. 1 and 2, when the self-testing module 1 detects a malfunction in the ground fault detection module 3, it can control the tripping module 2 to drive the switch module 4 to disconnect the power source. This allows users to safely use the appliance equipped with the ground fault circuit interrupter even if the users cannot recognize a malfunction in the ground fault circuit interrupter based on indicator lights.

In the embodiments of FIGS. 1 and 2, a control switch SW1 is coupled on the conducting path that supplies a working power to the self-testing module 1, the tripping module 2, and the ground fault detection module 3. The control switch SW1 is coupled on this conducting path between the phase line L on the input (LINE) side and the points where power is supplied to the above circuits, which are, respectively, the power supply circuit of the self-testing module 1 (R5, ZD1, and C3), the windings of the tripping coil (SOL1 and SOL2) of the tripping module 2, and (via R1) pin 3 of the leakage current detection chip U1 of the ground fault detection module 3. Thus, the control switch SW1 controls the supply of working power to these circuits, and when switch SW1 is open, these circuits will not operate. In alternative embodiments, the control switch SW1 may be coupled to the neutral line N, rather than the phase line L, on the input (LINE) side.

The control switch SW1 is mechanically linked to the switching module 4 (the reset switch RESET), as indicated in FIGS. 1 and 2 by the dotted lines that go from the tripping mechanism (solenoid SOL1 and SOL2) to the control switch SW1 and the reset switch RESET. The mechanical linking may be implemented by any suitable mechanical structure. Both the reset switch RESET and the control switch SW1 can be disconnected by the operation of the tripping mechanism (solenoid). When the reset switch RESET is reset (e.g. by the user pressing a reset button on the housing of the ground fault circuit interrupter device, in a manner familiar to those skilled in the relevant art), the control switch SW is also connected (closed) by the mechanical linking structure. By such mechanical linking, the control switch SW1 and the reset switch RESET are always open and closed at the same time.

A function of the control switch SW1 is to ensure that the self-testing module 1 starts the timing operation at a known time point, i.e., when the reset switch RESET (and hence the control switch SW1) is closed. When the reset switch RESET (and hence the control switch SW1) is open, the self-testing module 1 does not have power supply and therefore does not operate. Once the control switch SW1 is closed (when the reset switch RESET is reset), the self-testing module 1 starts the timing operation; as a result, the next time self-testing is performed will be one period (of the periodic timing circuit) after the reset. On the other hand, if the control switch SW1 is not present, i.e. the self-testing module 1 is always supplied with power from the LINE side (after the device is connected to the LINE side of the power supply) and the timing circuit continues to perform timing operation even when the reset switch is open (i.e. the device is in the tripped state), then the timing of the first occurrence of self-testing after a reset will be unpredictable. Therefore, by controlling the power supply to the self-testing module 1 using the control switch SW1, it can be ensured that the first self-testing after a reset occurs at a predicable time point after reset.

Moreover, when the ground fault detection module 3 ceases to function properly, for example, in cases of a short of the detection ring ZCT1, an open circuit at resistor R1, a defect in the leakage current detection chip U1, a short circuit at SCRs Q1 or Q4, etc., the control switch SW1 will become open, providing a safety measure.

Figure 3:
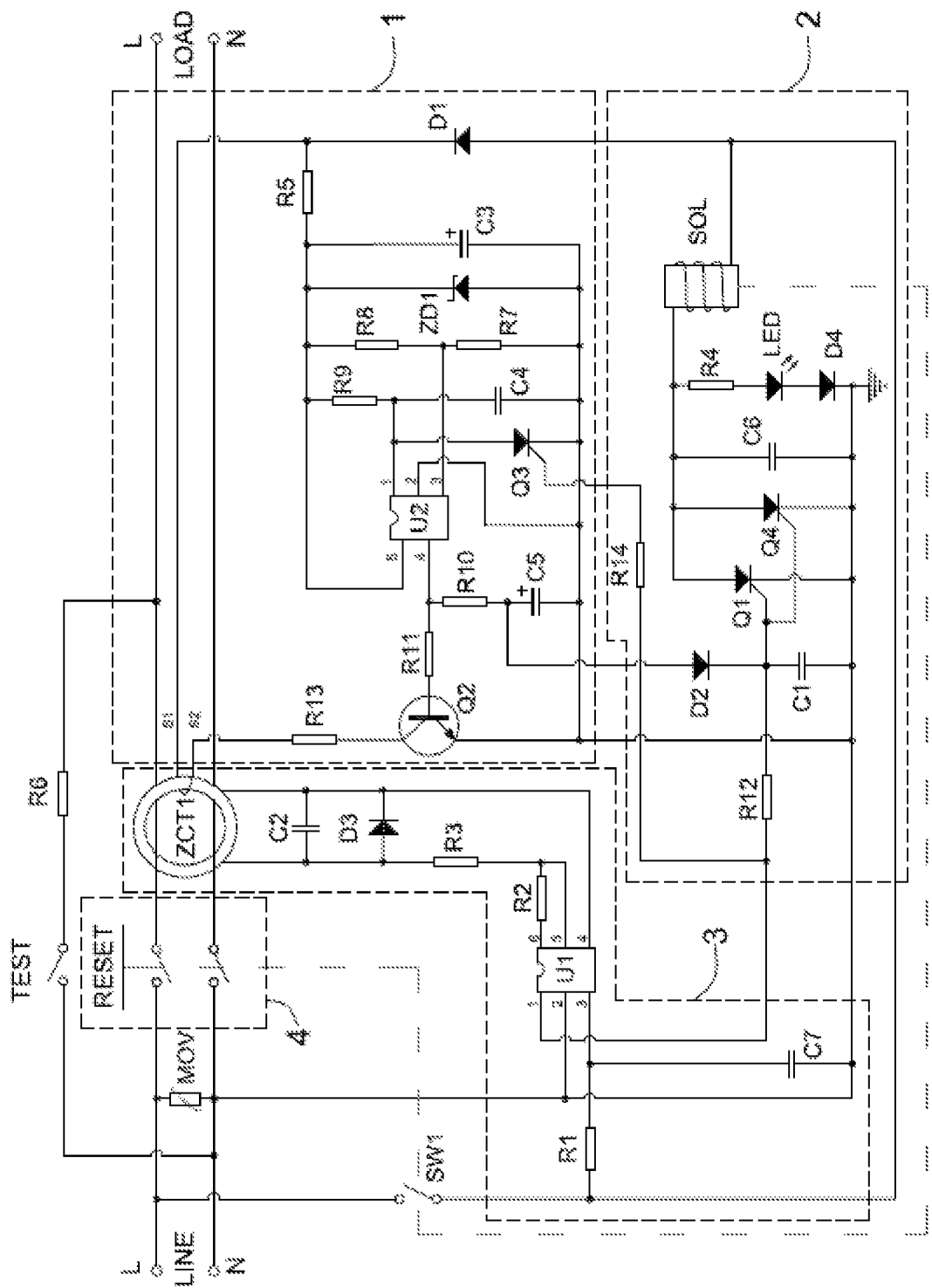
FIG. 3 is a circuit diagram showing a third embodiment of the present invention.

FIG. 3 is a circuit diagram showing a third embodiment of the present invention. This circuit is similar to that shown in FIGS. 1 and 2, but instead of two windings SOL1 and SOL2 as in FIGS. 1 and 2, the circuit in FIG. 3 has one winding (SOL) for the tripping coil. The function of the control switch SW1 is similar to that in the embodiment of FIGS. 1 and 2. In a further embodiment, the two parallel SCRs Q1 and Q4 can be changed to only one SCR.

Figure 4:
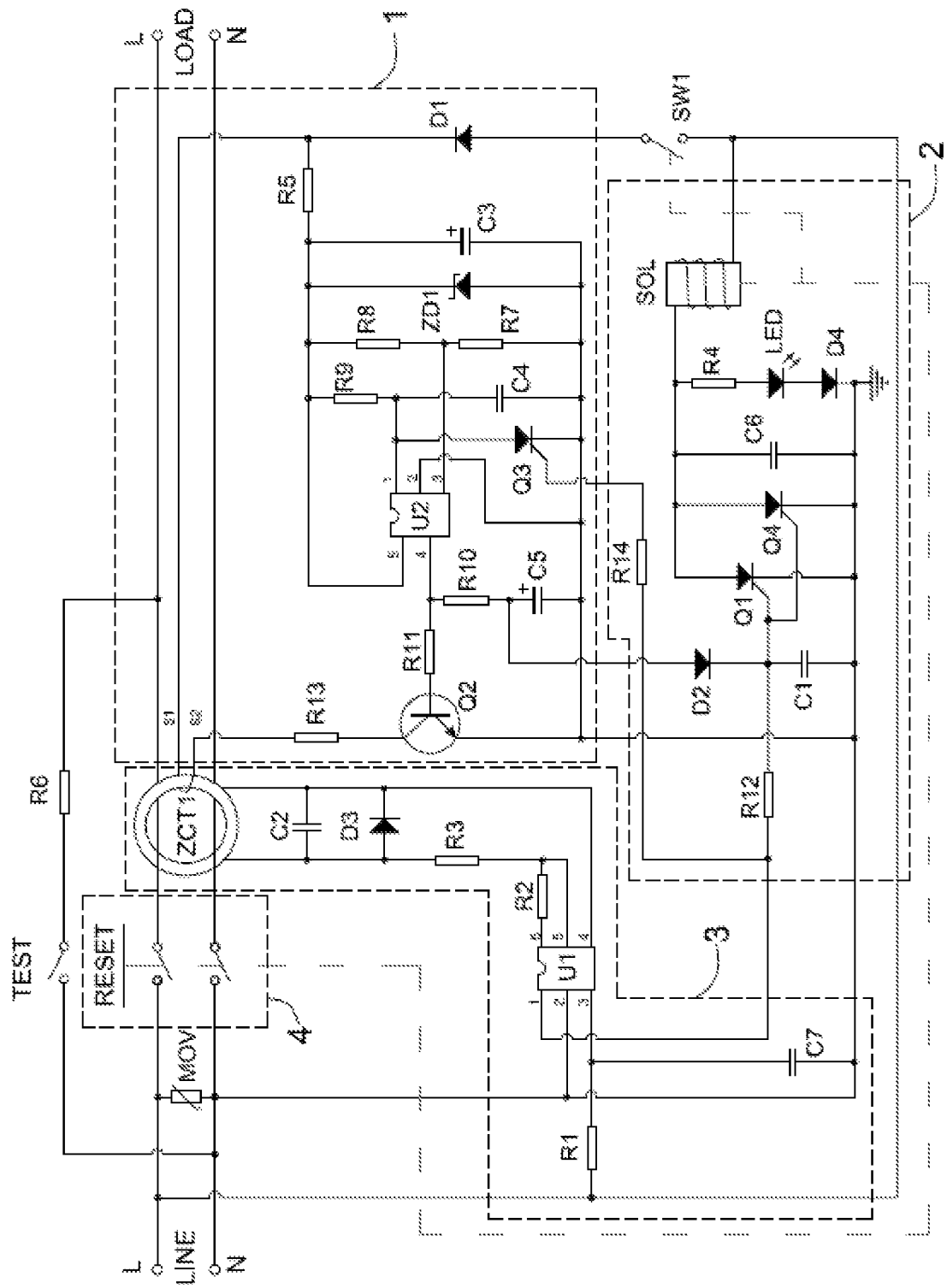
FIG. 4 is a circuit diagram showing a fourth embodiment of the present invention.

FIG. 4 is a circuit diagram showing the fourth embodiment of the present invention. This circuit is similar to that shown in FIG. 3, but the location of the control switch SW1 is more downstream: the control switch SW1 of FIG. 4 controls the supply of power to the self-testing module 1, but not the supply of power to the ground fault detection module 3 and the tripping module 2. In other words, the ground fault detection module 3 and the tripping module 2 are always supplied with power as long as the device is powered at the LINE side. The control switch SW1 functions the same way with respect to the self-testing module 1 as in the embodiments of FIGS. 1-3.

In summary, the ground fault circuit interrupter according to embodiments of this invention has a self-testing function. Also, during self-testing, the ground fault circuit interrupter can use indicator light, automatic disconnect, etc. methods to alert the user that the device should not be used any more. This makes it convenient for the different user groups to use the ground fault circuit interrupter safely and reliably, in particular users who cannot recognize a malfunction in the device based on the indicator lights. This ultimately leads to safe use of electrical appliances.

It will be apparent to those skilled in the art that various modification and variations can be made in the ground fault circuit interrupter device of the present invention without departing from the spirit or scope of the invention. Thus, it is intended that the present invention cover modifications and variations that come within the scope of the appended claims and their equivalents.

What is claimed is:

1. A ground fault circuit interrupter comprising:
a phase line and a neutral line;
a switch module including a reset switch, coupled on the phase line and the neutral line between an input end and an output end to control electrical connection between the input end and the output end;
a control switch, mechanically linked to the reset switch, wherein the control switch and the reset switch are either both open or both closed;
a ground fault detection module, for detecting whether a leakage current signal exists at the output end and generating a trip signal when the leakage current signal is detected;
a self-testing module, coupled to the ground fault detection module and periodically generating a self-test pulse signal which simulates the leakage current signal, the self-testing module including a power supply circuit; and
a tripping module, electrically coupled to the ground fault detection module and mechanically coupled to the switch module and the control switch, the tripping module being operable to open the reset switch and the control switch in response to the trip signal;
wherein the control switch is connected on a conducting path between either the phase line or the neutral line at the input end and the power supply circuit of the self-testing module, and wherein when the control switch is open, no power is supplied to the power supply circuit of the self-testing module and the self-testing module is non-operational.

2. The ground fault circuit interrupter of claim 1, wherein the tripping module includes:
a tripping mechanism;
a tripping coil disposed on the tripping mechanism;
a semiconductor device, coupled to the tripping coil, and further coupled to the ground fault detection module, the semiconductor device and the tripping coil forming a tripping drive component,
wherein when the ground fault detection module detects the leakage current signal, the ground fault detection module causes the semiconductor device to become conductive to drive the switch module to electrically disconnect the output end from the input end.

3. The ground fault circuit interrupter of claim 1, wherein the ground fault detection module includes a periodic timing circuit and a self-test pulse signal circuit coupled to each other, wherein the periodic timing circuit controls a timing interval of generation of the self-test pulse signal by the self-test pulse signal circuit.

4. The ground fault circuit interrupter of claim 3, wherein the self-test pulse signal circuit includes a switch device and a shunt reference coupled to the switch device, wherein the periodic timing circuit is coupled to the shunt reference to control the switch device to generate the self-test pulse signal.

5. The ground fault circuit interrupter of claim 3, wherein the self-test pulse signal circuit includes a switch device and a comparator coupled to the switch device, wherein the periodic timing circuit is coupled to the comparator to control the switch device to generate the self-test pulse signal.

6. The ground fault circuit interrupter of claim 3, wherein the power supply circuit supplies power to the self-test pulse signal circuit and/or the periodic timing circuit.

7. The ground fault circuit interrupter of claim 1, wherein the ground fault detection module includes:
a leakage current detection ring for detecting whether a leakage current signal exists between the phase line and the neutral line at the output end; and
a leakage current detection unit coupled to the leakage current detection ring and to the tripping module,
wherein when the leakage current detection unit detects a leakage current signal via the leakage current detection ring, it controls the tripping module to drive the switch module to electrically disconnect the output end from the input end.

* * * * *